United States Patent
Shao et al.

(10) Patent No.: US 12,317,484 B2
(45) Date of Patent: May 27, 2025

(54) METHOD FOR FORMING A FIRST AND A SECOND TRANSISTORS ARRAY HAVING PLURALITY OF FIRST AND SEMICONDUCTOR PILLARS

(71) Applicant: CHANGXIN MEMORY TECHNOLOGIES, INC., Hefei (CN)

(72) Inventors: Guangsu Shao, Hefei (CN); Deyuan Xiao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 413 days.

(21) Appl. No.: 17/879,779

(22) Filed: Aug. 3, 2022

(65) Prior Publication Data
US 2023/0413537 A1   Dec. 21, 2023

(30) Foreign Application Priority Data
Jun. 15, 2022 (CN) .......................... 202210681886.5

(51) Int. Cl.
H10B 12/00 (2023.01)
(52) U.S. Cl.
CPC ......... *H10B 12/488* (2023.02); *H10B 12/053* (2023.02); *H10B 12/482* (2023.02)
(58) Field of Classification Search
CPC .... H10B 12/05; H10B 12/053; H10B 12/482; H10B 12/488

USPC .................................................. 438/156, 157
See application file for complete search history.

(56) References Cited

U.S. PATENT DOCUMENTS

2021/0151437 A1   5/2021   Tomishima
2023/0024307 A1*  1/2023   Lee .................... H10B 12/036

* cited by examiner

*Primary Examiner* — Hoai V Pham
(74) *Attorney, Agent, or Firm* — Kilpatrick Townsend & Stockton LLP

(57) ABSTRACT

Embodiments provide a semiconductor structure and a fabrication method. The method includes: providing a semiconductor substrate, the semiconductor substrate being provided with a plurality of first bit lines extending along a first direction; forming a first transistor array on the semiconductor substrate, the first transistor array including a plurality of first semiconductor pillars; forming first word lines, each of the plurality of first semiconductor pillars being connected to a corresponding one of the first word lines and a corresponding one of the plurality of first bit lines; forming a second transistor array on the first transistor array, the second transistor array including a plurality of second semiconductor pillars, and the plurality of first semiconductor pillars being corresponding to the plurality of second semiconductor pillars one to one; and forming second word lines and second bit lines to form a 2T0C semiconductor structure.

14 Claims, 8 Drawing Sheets

METHOD FOR FORMING A FIRST AND A SECOND TRANSISTORS ARRAY HAVING PLURALITY OF FIRST AND SEMICONDUCTOR PILLARS

CROSS-REFERENCE TO RELATED APPLICATION

This application claims priority to Chinese Patent Application No. 202210681886.5, titled "SEMICONDUCTOR STRUCTURE AND FABRICATION METHOD THEREOF" and filed to the State Patent Intellectual Property Office on Jun. 15, 2022, the entire contents of which are incorporated herein by reference.

TECHNICAL FIELD

The present disclosure relates to the field of semiconductors, and more particularly, to a semiconductor structure and a fabrication method thereof.

BACKGROUND

As higher and higher requirements are raised for storage performance and cell size of the DRAM cell, a severe challenge is brought to the 1T1C cell. Studies have shown that a transistor with a certain size and appropriate dopant may also hold a small amount of charges without requiring any capacitor, this is because a gate of the transistor is a natural capacitor. By forming a 2T0C embedded DRAM structure, a capacitor-free structure with two transistors is fabricated, which can simplify capacitor processes in fabrication procedures of a semiconductor structure.

SUMMARY

Embodiments of the present disclosure provide a semiconductor structure and a fabrication method thereof, to form a 2T0C semiconductor structure, which can simplify capacitor processes in fabrication procedures of the semiconductor structure.

An embodiment of the present disclosure provides a method for fabricating a semiconductor structure. The method includes: providing a semiconductor substrate, where the semiconductor substrate is provided with a plurality of first bit lines extending along a first direction; forming a first transistor array on the semiconductor substrate, where the first transistor array includes a plurality of first semiconductor pillars; forming first word lines, where each of the plurality of first semiconductor pillars is connected to a corresponding one of the first word lines and a corresponding one of the plurality of first bit lines; forming a second transistor array on the first transistor array, where the second transistor array includes a plurality of second semiconductor pillars, where the plurality of first semiconductor pillars are corresponding to the plurality of second semiconductor pillars one to one; and forming second word lines and second bit lines, where each of the plurality of second semiconductor pillars is connected to a corresponding one of the second word lines and a corresponding one of the second bit lines.

Another embodiment of the present disclosure further provides a semiconductor structure, which is fabricated by means of the method for fabricating a semiconductor structure according to any one of the above embodiments. The semiconductor structure includes: a semiconductor substrate, where the semiconductor substrate is provided with a plurality of first bit lines extending along a first direction; a first transistor array positioned on the semiconductor substrate, where the first transistor array includes a plurality of first semiconductor pillars; first word lines, where each of the plurality of first semiconductor pillars is connected to a corresponding one of the first word lines and a corresponding one of the plurality of first bit lines; a second transistor array positioned on the first transistor array, where the second transistor array includes a plurality of second semiconductor pillars, and the plurality of first semiconductor pillars correspond to the plurality of second semiconductor pillars one to one; and second word lines and second bit lines, where each of the plurality of second semiconductor pillars is connected to a corresponding one of the second word lines and a corresponding one of the second bit lines.

BRIEF DESCRIPTION OF THE DRAWINGS

Exemplary descriptions are made to one or more embodiments with reference to pictures in the corresponding drawings, and these exemplary descriptions do not constitute limitations on the embodiments. Unless otherwise stated, the figures in the accompanying drawings do not constitute a scale limitation. To describe the technical solutions of the embodiments of the present disclosure or those of the prior art more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

As can be known from the background art, by forming a 2T0C embedded DRAM structure, a capacitor-free structure with two transistors is fabricated, which can simplify capacitor processes in fabrication procedures of the semiconductor structure.

Based on analysis, it is found that a small transistor with a certain size and appropriate dopant may also hold a small amount of charges without requiring any capacitor. This is because as a natural capacitor, a gate of the transistor can store a small amount of charges. Therefore, compared with a conventional 1T1C DRAM structure, which requires a structure where one transistor correspond to one capacitor, the 2T0C embedded DRAM structure may form the capacitor-free structure with two transistors, to save fabrication procedures of the capacitor in the fabrication processes of the semiconductor structure, thereby improving fabrication efficiency of the semiconductor structure. Moreover, the formation of the capacitor does not require too much space, which may further increase integration density of the transistor.

An embodiment of the present disclosure provides a method for fabricating a semiconductor structure, to form a 2T0C semiconductor structure and simplify capacitor processes in fabrication procedures of the semiconductor structure.

The embodiments of the present disclosure will be described in detail below in conjunction with the accompanying drawings. However, a person of ordinary skill in the art may understand that in the embodiments of the present disclosure, many technical details are put forward such that a reader may better understand the present disclosure. However, the technical solutions requested to be protected by the present disclosure may also be implemented even without these technical details or various variations and modifications based on the following embodiments.

Figure 1:
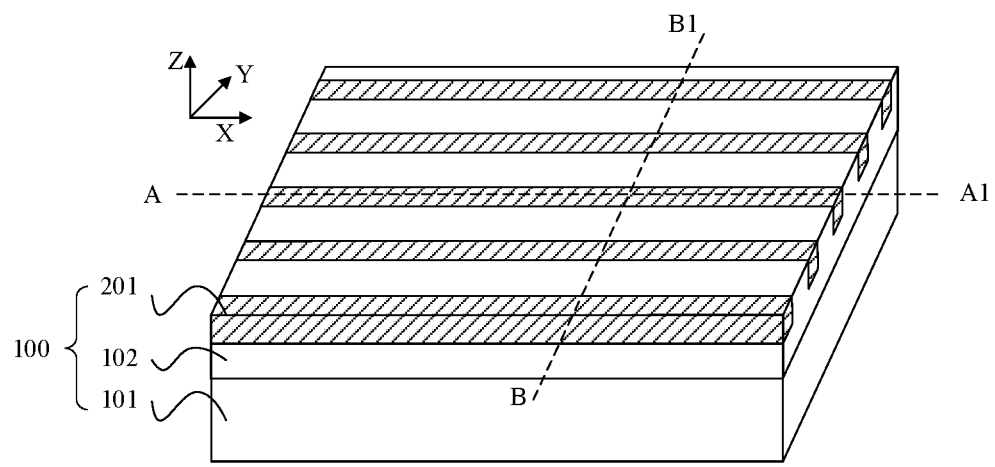
FIGS. 1 to 13 are schematic structural diagrams corresponding to steps of a method for fabricating a semiconductor structure according to an embodiment of the present disclosure.
Figure 7:
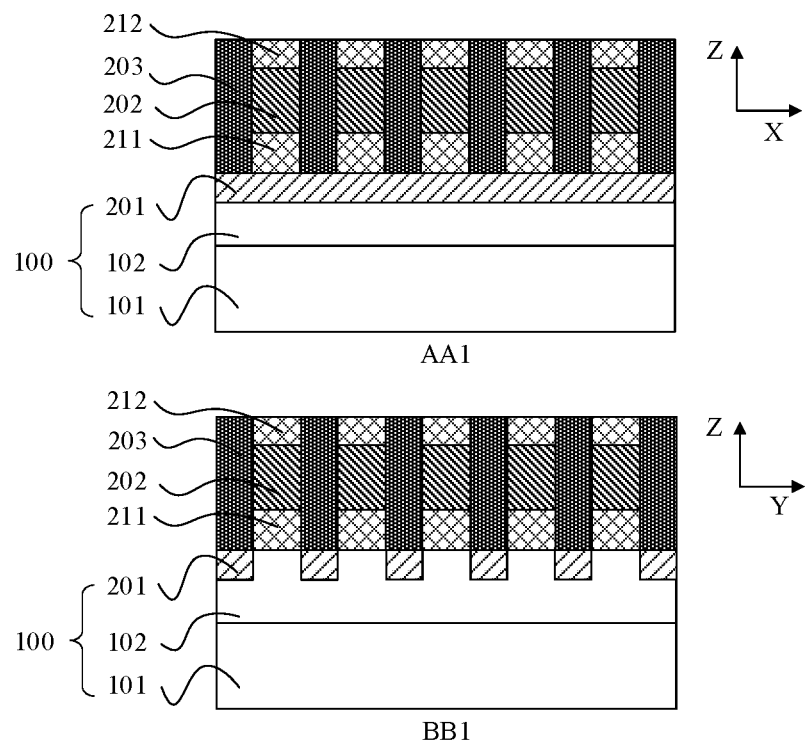
Figure 8:
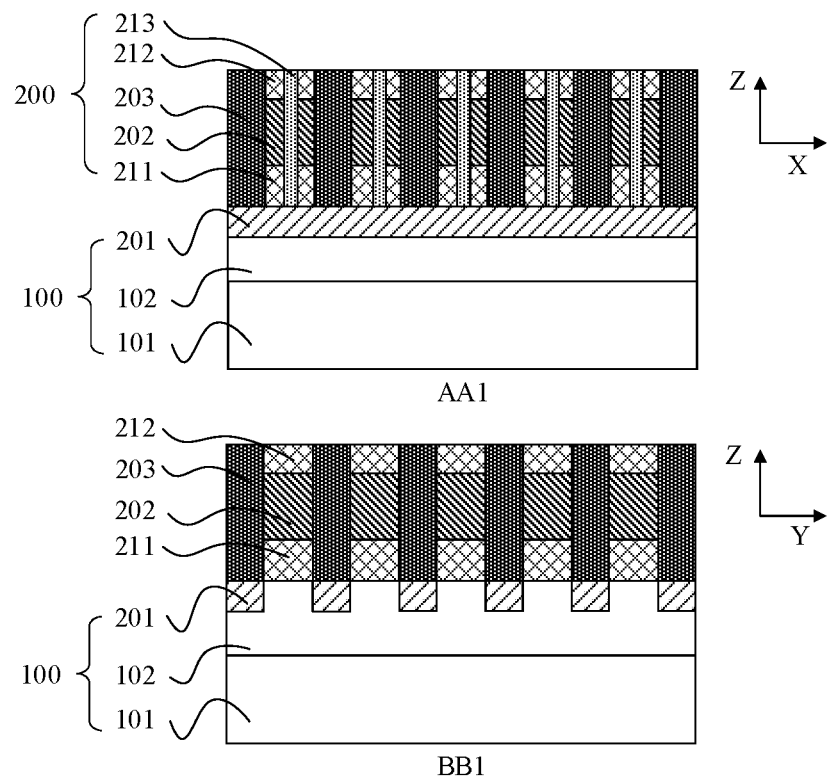
Figure 9:
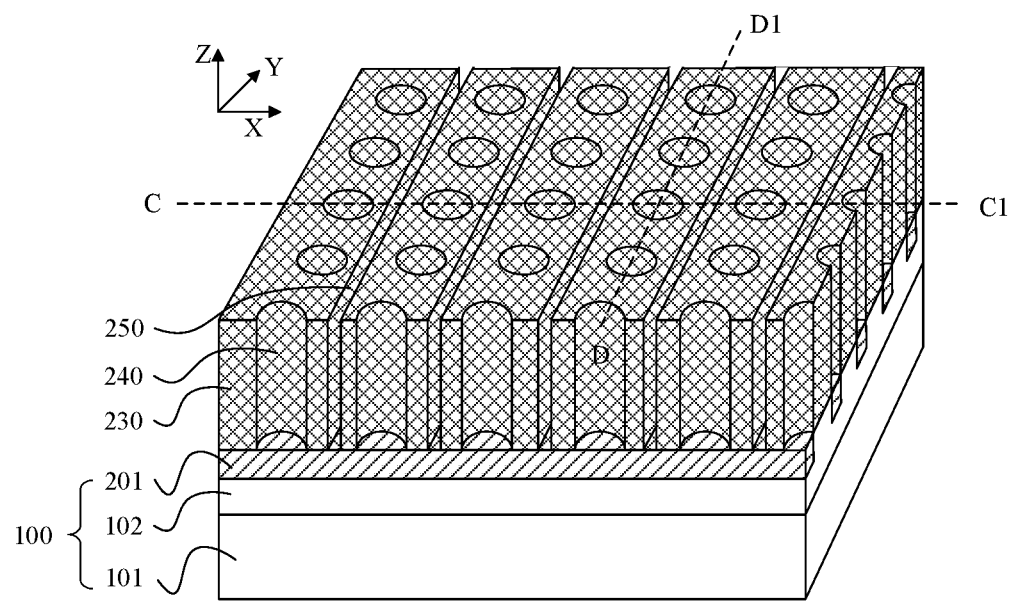
Figure 10:
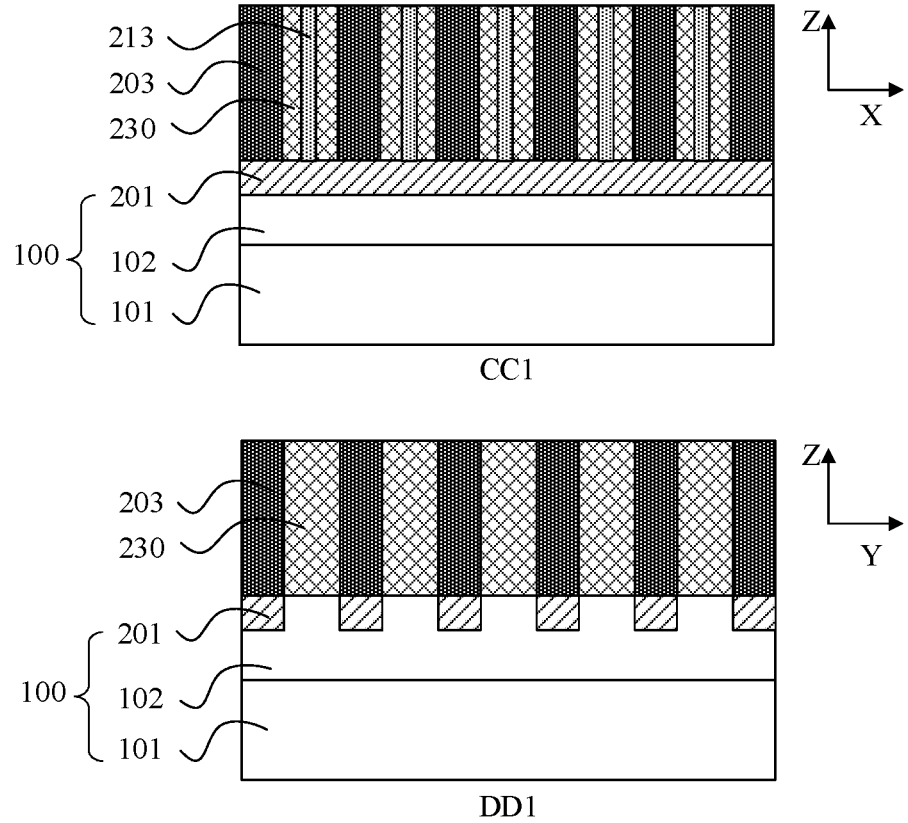

FIGS. 1 to 13 are schematic structural diagrams corresponding to steps of the method for fabricating a semiconductor structure according to this embodiment of the present disclosure, where FIGS. 1 to 8 and FIGS. 11 to 13 are schematic cross-sectional structural diagrams along a direction AA1 and a direction BB1 in FIG. 1, and FIG. 10 is a schematic cross-sectional structural diagram along a direction CC1 and a direction DD1 in FIG. 9. The method for fabricating a semiconductor structure according to this embodiment will describe in detail below with reference to the accompanying drawings, and the details are as follows.

The method for fabricating a semiconductor structure includes following steps.

Referring to FIG. 1, a semiconductor substrate 100 is provided, where the semiconductor substrate 100 is provided with a plurality of first bit lines 201 extending along a first direction X.

In some embodiments, the step of providing a semiconductor substrate 100 may include: providing a substrate 101, and forming a first insulating structure 102 to cover a surface of the substrate 101; forming a plurality of first bit line trenches extending along the first direction X in a first insulating layer 314, the first bit line trenches being arranged at intervals in parallel with each other in a second direction Y, and filling the first bit line trenches to form the first bit lines 201.

It should be noted that in this embodiment, an angle between the first direction X and the second direction Y is 90°. This embodiment does not constitute a limitation on a concrete angle between the first direction X and the second direction Y. In a concrete application, the angle between the first direction X and the second direction Y may be set to 30°, 45°, or 60° according to a concrete application scenario.

For the substrate 101, a material of the substrate 101 may be an elemental semiconductor material or a crystalline inorganic compound semiconductor material. The elemental semiconductor material may be silicon or germanium; and the crystalline inorganic compound semiconductor material may be silicon carbide, silicon germanium, gallium arsenide, or indium gallium, etc.

For the first insulating structure 102, a material for forming the first insulating structure 102 includes an insulating material such as silicon oxide, silicon nitride, and silicon oxynitride. The first insulating structure 102 is configured to isolate adjacent two of the first bit lines 201 and prevent interconnection between the first bit lines 201 from having a negative effect on performance of the semiconductor structure.

For the first bit lines 201, a material for forming the first bit lines 201 includes at least one of a metal silicide, copper, or tungsten. In some embodiments, a material for forming the first bit lines 201 may be a single metal, a metal compound, or an alloy. The single metal may be copper, aluminum, tungsten, gold, or silver, etc.; the metal compound may be tantalum nitride or titanium nitride; and the alloy may be an alloy material comprising at least two of copper, aluminum, tungsten, gold, or silver. Setting the material of the first bit line 201 as a metal material may allow the first bit line to have a lower resistivity, thereby reducing resistance of the first bit line 201, increasing transmission rate of an electrical signal in the first bit line 201, reducing parasitic capacitance of the first bit line 201, and reducing heat loss to reduce power consumption.

Figure 2:
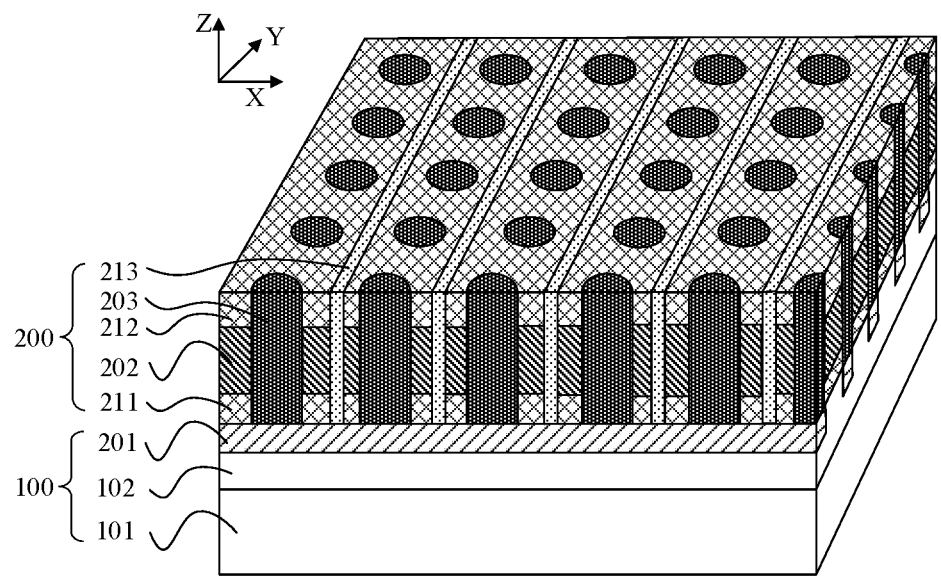

Referring to FIG. 1 and FIG. 2, a first transistor array 200 is formed on the semiconductor substrate 100, where the first transistor array 200 includes a plurality of first semiconductor pillars 203.

In some embodiments, referring to FIG. 2, the first semiconductor pillars 203 extend along a third direction Z and are arranged in an array along the first direction X and the second direction Y. Bottoms of different first semiconductor pillars 203 in the first direction X contact a same one of the first bit lines 201, and bottoms of different first semiconductor pillars 203 in the second direction Y contact different first bit lines 201. First word lines 202 are formed, where each of the first semiconductor pillars 203 is connected to a corresponding one of the first word lines 202 and a corresponding one of the first bit lines 201, and the first word lines 202 extend along the second direction Y and surround the first semiconductor pillars 203. By forming the first transistor array having a gate-all-around structure, capability of the first transistors in controlling current is improved, thereby improving usage performance of the semiconductor structure. Furthermore, the gate-all-around structure can increase the integration density of the semiconductor structure.

It should be noted that in this embodiment, an angle between the third direction Z and a plane where the first direction X and the second direction Y are positioned is 90°. This embodiment does not constitute a limitation on the angle between the third direction Z and the plane where the first direction X and the second direction Y are positioned. According to a concrete application scenario, the angle between the third direction Z and the plane where the first direction X and the second direction Y are positioned may be 30°, 45°, or 60°.

Figure 3:
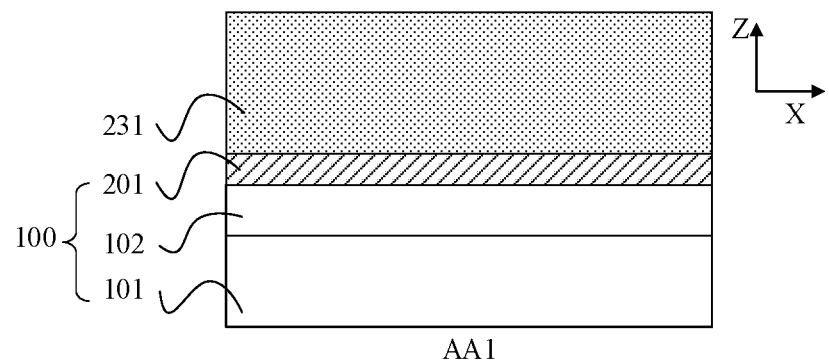
Figure 3:
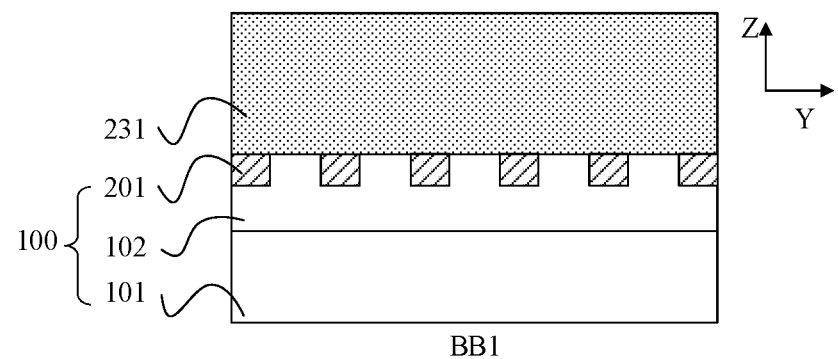
Figure 4:
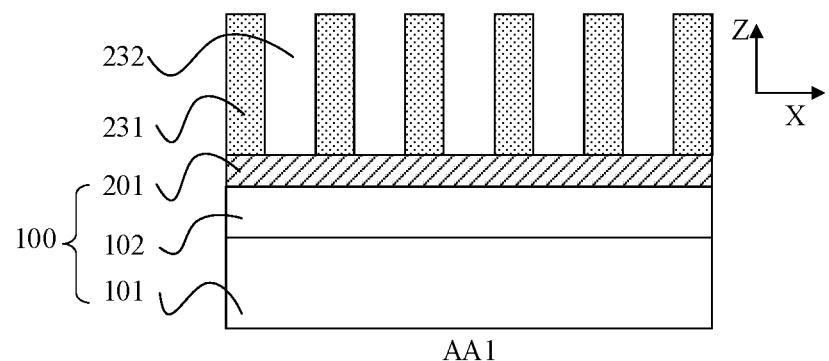
Figure 4:
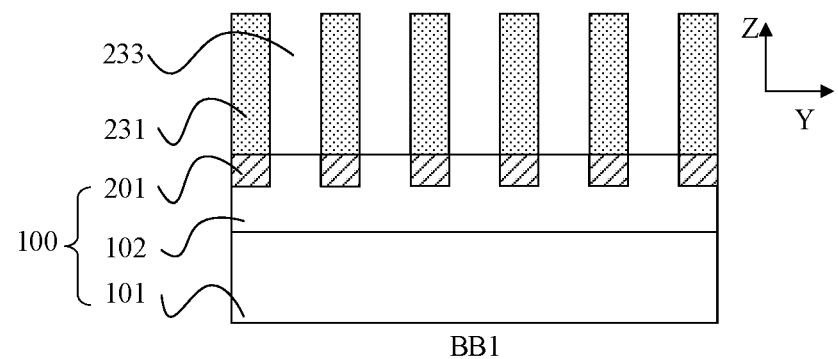
Figure 5:
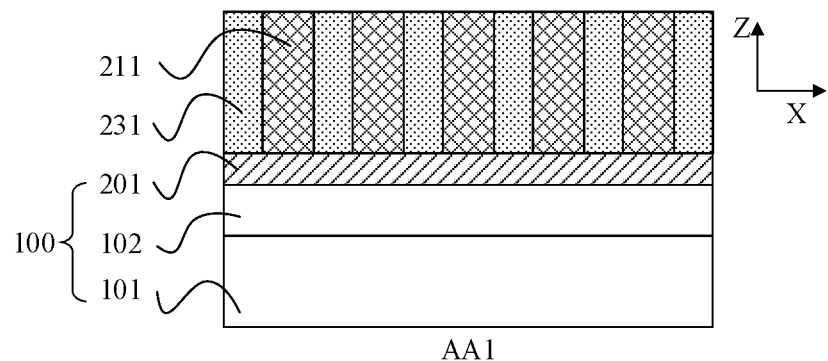
Figure 5:
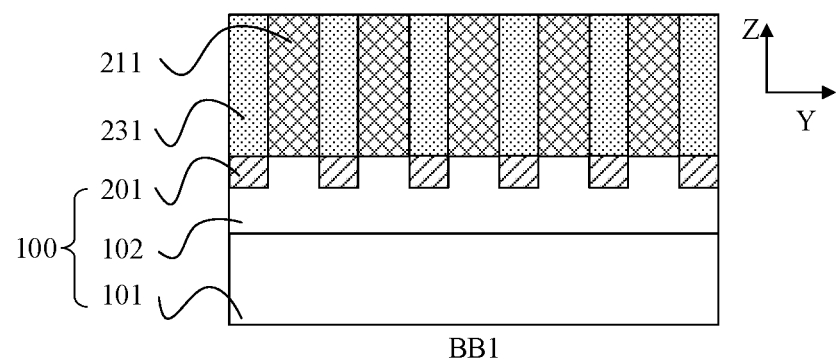
Figure 6:
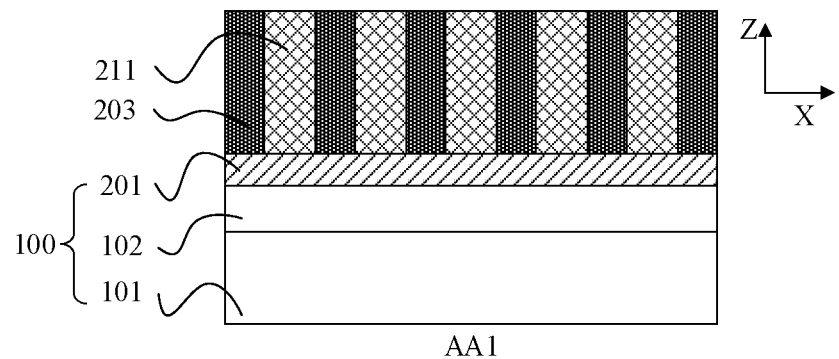
Figure 6:
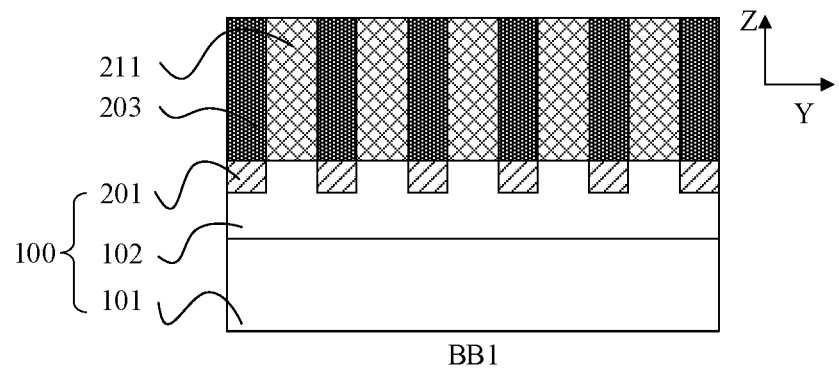

This embodiment provides two methods for forming the first transistor array 200. In some embodiments, in one example, the forming a first transistor array 200 includes following steps. Referring to FIG. 3, a first sacrificial layer 231 is formed, where the first sacrificial layer 231 covers the surface of the semiconductor substrate 100. Referring to FIG. 4, a plurality of first trenches 233 extending along the first direction X and a plurality of second trenches 232 extending along the second direction Y are formed, where the first trenches 233 and the second trenches 232 are positioned in the first sacrificial layer 231, bottoms of the first trenches and bottoms of the second trenches are flush with top surfaces of the first bit lines 201, and in the second direction, projections of the first trenches 233 and projections of the first bit lines 201 are parallel to each other and are alternately arranged. Referring to FIG. 5, first isolation structures 211 are formed to fill the first trenches 233 and the second trenches 232. Referring to FIG. 6, the first sacrificial layer 231 between the first isolation structures 211 is removed, and the first semiconductor pillars 203 are formed to fill a gap between adjacent two of the first isolation structures 211.

For the first sacrificial layer 231 and the first isolation structure 211, materials for forming the first sacrificial layer 231 and materials for forming the first isolation structure 211 include silicon oxide, silicon nitride, silicon oxynitride, etc. When the materials for forming the first sacrificial layer 231 are different from the materials for forming the first isolation structure 211, the first sacrificial layer 231 and the first isolation structure 211 may be etched to different degrees under a same etching condition, such that the first sacrificial layer 231 is removed and the first sacrificial layer 231 is retained, making it easy to subsequently fill a gap between adjacent two of the first isolation structures 211 to form the first semiconductor pillar 203.

In some embodiments, after forming the first trench 233 and the second trench 232 and before filling the first isolation structure 211, the method may also include performing corner rounding treatment, such that a remaining part of the first sacrificial layer 231 forms a cylindrical structure, to subsequently remove the first sacrificial layer 231 and form a smooth transition on the surface of the first semiconductor pillar 203. In this way, when the first semiconductor pillar 203 runs in the semiconductor structure, it is beneficial to avoid occurrence of tip discharge or electric leakage of the first semiconductor pillar 203.

In another example, the step of the forming a first transistor array includes: forming an initial first isolation structure covering a surface of the semiconductor substrate; forming a plurality of first semiconductor holes extending along the third direction, where the plurality of first semiconductor holes are positioned in the initial first isolation structure and are arranged in an array along the first direction and the second direction, in the first direction different first semiconductor holes expose part of the top surface of the same first bit line, in the second direction different first semiconductor holes expose part of the top surfaces of different first bit lines, and a remaining part of the initial first isolation structure is used as the first isolation structure; and forming the first semiconductor pillars to fill the first semiconductor holes.

For an initial first isolation structure, a material for forming the initial first isolation structure includes silicon oxide, silicon nitride, silicon oxynitride, etc.

In some embodiments, a shape of the first semiconductor hole may be a circle, an ellipse, or a polygon, to facilitate subsequent filling to form a smooth transition on the surface of the first semiconductor pillar, thereby avoiding occurrence of tip discharge or electric leakage of the first semiconductor pillar during operation. It is to be understood that corners of the polygon may be chamfered, such that an angle of the first semiconductor pillar is smoothly transitioned, which may avoid occurrence of tip discharge or electric leakage.

For the first semiconductor pillar 203, a material for forming the first semiconductor pillar 203 includes at least one of Indium Gallium Zinc Oxide (IGZO), Indium Zinc Oxide (IZO), or Indium Tin Oxide (ITO). When the first semiconductor pillar 203 is made of the above materials, it is beneficial to increase carrier mobility of the first semiconductor pillar 203, thereby making it easy for the first semiconductor pillar 203 to transmit an electric signal more efficiently. For example, when the first semiconductor pillar 203 is made of IGZO, the carrier mobility of IGZO is 20-50 times that of polycrystalline silicon, which is beneficial to increase the carrier mobility of the first semiconductor pillar 203, thereby facilitating reducing the leakage current of the semiconductor structure during operation. Thus, the power consumption of the semiconductor structure is reduced, and operation efficiency of the semiconductor structure is improved. In addition, retention time of a memory cell configured for a gate-all-around transistor formed by the first semiconductor pillar 203 made of IGZO may exceed 400 s, which is beneficial to reduce a refresh rate and power consumption of a memory.

Based on the above two methods for forming the first transistor array 200, first word lines 202 are formed, and each of the first semiconductor pillars 203 is connected to a corresponding one of the first word lines 202 and a corresponding one of the first bit lines 201. The step of forming first word lines 202 includes following steps. Referring to FIG. 7, the first isolation structure 211 is removed by part of a height. The first word lines 202 is formed to cover a surface of the first isolation structure 211, and a top surface of the first word line 202 is lower than that of the first semiconductor pillar 203. A second isolation structure 212 is formed to cover a surface of the first word line 202, and the top surface of the second isolation structure 212 is flush with that of the first semiconductor pillar 203. Referring to FIG. 8, a first spacer 213 is formed, where the first spacer 213 extends along the second direction Y and is positioned between adjacent two columns of the first semiconductor pillars 203, a height of the first spacer 213 is equal to that of the first semiconductor pillar 203, and in the first direction X, the first spacer 213 and the first semiconductor pillar 203 are alternately arranged at intervals. A first spacer 213 is positioned between adjacent two columns of the first semiconductor pillars 203 along the second direction Y, and may separate the first word lines 202 along the second direction Y, such that a same column of the first semiconductor pillars 203 in the second direction Y share a same one of the first word lines 202, thereby improving the control capability of the first word lines 202 to the first transistor array 200.

For the first word line 202, in some embodiments, the step of forming the first word line includes: forming a gate dielectric layer covering the surface of the first semiconductor pillar; and forming a gate conductive layer, where the gate conductive layer covers the surface of the gate dielectric layer and fills a gap between adjacent two of the first semiconductor pillars. The gate dielectric layer covers the surface of the first semiconductor pillar, which may prevent the gate conductive layer from reacting with the first semiconductor pillar in subsequent processes, thereby avoiding damage to the semiconductor structure.

For the gate dielectric layer, a material for forming the gate dielectric layer includes at least one of silicon oxide, silicon nitride, or silicon oxynitride.

For the gate conductive layer, a material for forming the gate conductive layer includes at least one of polycrystalline silicon, titanium nitride, titanium aluminide, tantalum nitride, tantalum, copper, aluminum, lanthanum, or tungsten.

For the second isolation structure 212 and the first spacer 213, materials for forming the second isolation structure 212 and the first spacer 213 include silicon oxide, silicon nitride, silicon oxynitride, etc. In this embodiment, the materials for forming the second isolation structure 212 and the first isolation structure 211 are the same and are represented by a same feature. The materials for forming the first spacer 213 and the materials for forming the first isolation structure 211 are different and are represented by different features. In other embodiments, the materials for forming the second isolation structure 212 and the materials for forming the first isolation structure 211 may be different, and the materials for forming the first spacer 213 and the materials for forming the first isolation structure 211 may be the same.

This embodiment also provides a method for forming a first transistor array and forming a first word line. In some embodiments, referring to FIG. 9, an initial first isolation structure 230 is formed, where the initial first isolation structure 230 covers the surface of the semiconductor substrate 100. A plurality of first isolation trenches 250 extending along the second direction Y and a plurality of first semiconductor holes 240 extending along the third direction Z are formed, where the first isolation trenches 250 and the first semiconductor holes 240 are positioned in the initial first isolation structure 230, and the first semiconductor holes 240 are arranged in an array along the first direction X and the second direction Y. Different first semiconductor holes 240 in the first direction X expose a part of the top surface of the same first bit line 201, in the second direction Y different first semiconductor holes 240 expose part of the top surfaces of different first bit lines 201, and in the first direction X, the first isolation trenches 250 and the first semiconductor holes 240 are alternately arranged at intervals, where a depth of the first isolation trench 250 is equal to that of the first semiconductor hole 240. Referring to FIG. 10, the first spacer 213 is formed to fill the first isolation trench 250, and the first semiconductor pillar 203 is formed to fill the first semiconductor hole 240. Referring back to FIG. 8, the initial first isolation structure 230 is removed by part of a height, where a remaining part of the initial first isolation structure 230 is used as the first isolation structure 211. The first word line 202 is formed to cover the surface of the first isolation structure 211, and the top surface of the first word line 202 is lower than that of the first semiconductor pillar 203. A second isolation structure 212 is formed to cover the first word line 202, and the top surface of the second isolation structure 212 is flush with that of the first semiconductor pillar 203. In this way, the first transistor array 200 is formed. In this method, the first spacer 213 and the first semiconductor pillar 203 are first formed, and then the first word line 202 is formed, which may avoid the process of etching the first word line 202 after subsequent formation of the first word line 202, such that the method for forming the first word line 202 is simplified, and thus the fabrication efficiency of the semiconductor structure is improved.

By means of the method for forming the first transistor array 200 and the method for forming the first word line 202 provided in the above three embodiments, etching of the first semiconductor pillar 203 may be reduced. For example, when the material of the first semiconductor pillar 203 is an amorphous material such as IGZO, the etching needs to consume a lot of costs. For example, the power consumption of a device body, an exhaust gas treatment system, and a peripheral gas supply system in dry etching is relatively large, and maintenance costs are relatively high, and there also exists a problem of particle pollution to the device, which shortens service life of the device. However, wet etching is performed isotropically, and there exists a problem of undercut under a mask. Therefore, using the method for forming the first transistor array 200 and the method for forming the first word line 202 in the above embodiments may reduce the etching of the amorphous material such as IGZO, thereby avoiding the above problems.

Figure 11:
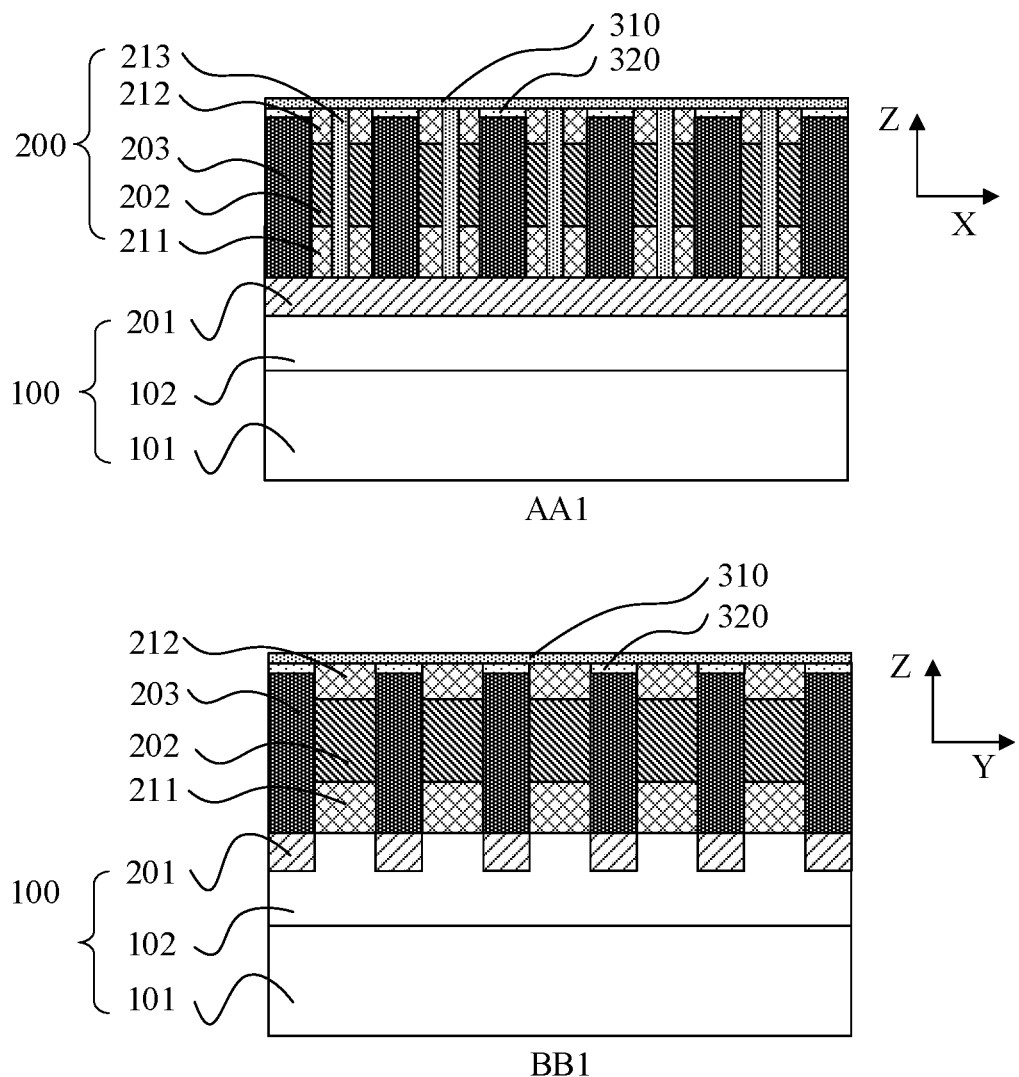

Referring to FIG. 11, in some embodiments, after forming the first word line 202 and before forming the second transistor layer, the method further includes: removing the first semiconductor pillar 203 by part of a height and forming a contact structure 320, where the contact structure 320 is positioned on the top surface of the first semiconductor pillar 203; forming a dielectric layer 310, where the dielectric layer 310 covers at least a surface of the contact structure 320 and also covers the top surface of the second isolation structure 212 and the top surface of the first spacer 213. The contact structure 320 connects one terminal of a source or a drain of a first transistor to a gate of a second transistor, and the dielectric layer 310 may constitute an insulating layer of a gate part of the second transistor array. By means of the contact structure 320 and the dielectric layer 310, a structure is formed where the first semiconductor pillars 203 correspond to the second semiconductor pillars one to one.

For the contact structure 320, a material for forming the contact structure 320 includes at least one of a metal silicide, copper, or tungsten. In some embodiments, the material for forming the contact structure 320 may be a single metal, a metal compound, or an alloy. The single metal may be copper, aluminum, tungsten, gold, or silver, etc.; the metal compound may be tantalum nitride or titanium nitride; and the alloy may be an alloy material comprising at least two of copper, aluminum, tungsten, gold, or silver.

For the dielectric layer 310, a material for forming the dielectric layer 310 includes silicon oxide, silicon nitride, or silicon oxynitride, etc. In this embodiment, the material for forming the dielectric layer 310 and the material for forming the first spacer 213 are the same and are represented by a same feature. In other embodiments, the material for forming the dielectric layer 310 may be different from the material for forming the first spacer 213.

Figure 12:
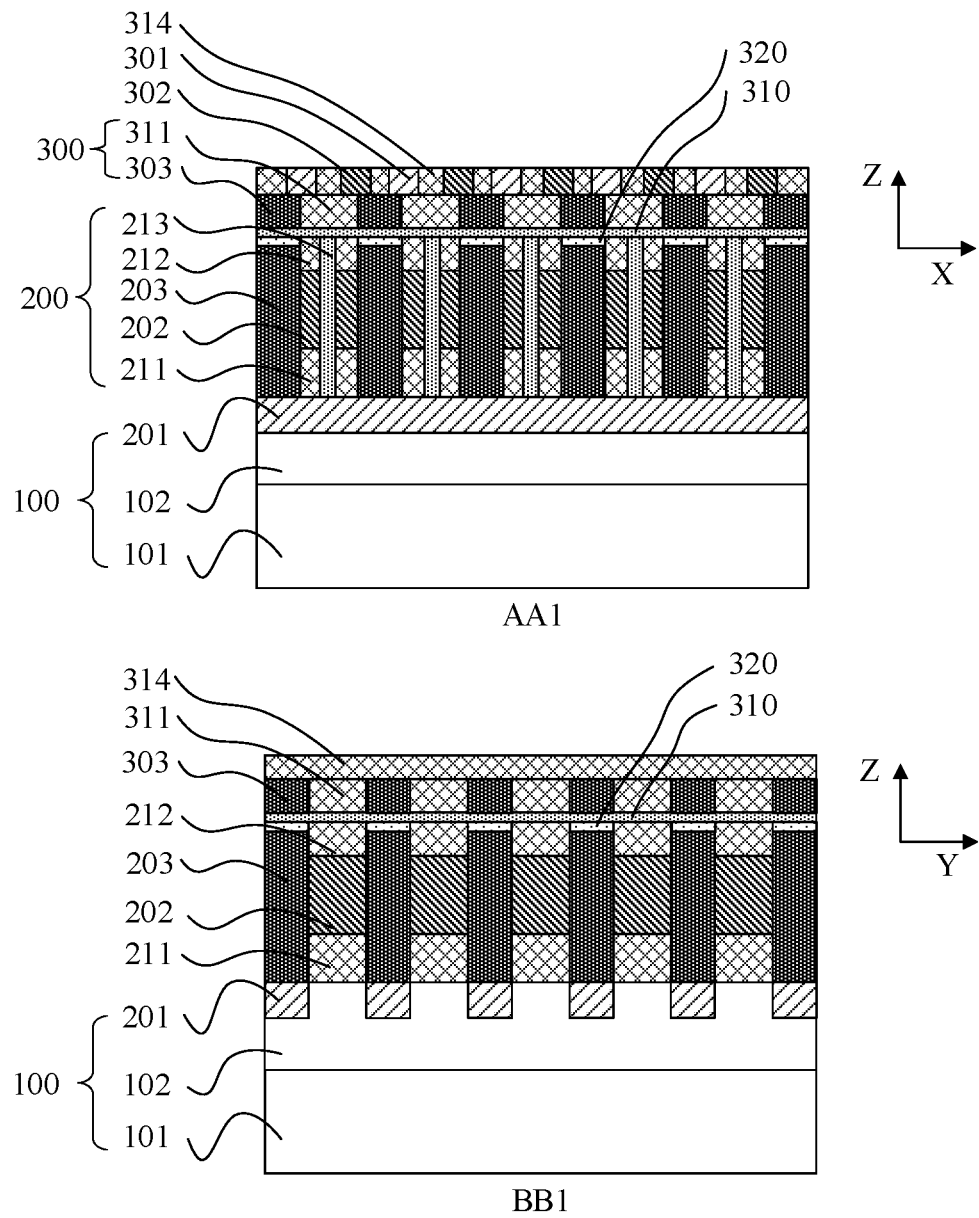

Referring to FIG. 12, a second transistor array 300 is formed on the first transistor array 200, where the second transistor array 300 covers the surface of the dielectric layer 310 and includes a plurality of second semiconductor pillars 303 extending along the third direction Z, and the second semiconductor pillars 303 are arranged in an array along the first direction X and the second direction Y, and the first semiconductor pillars 203 correspond to the second semiconductor pillars 303 one to one. A third isolation structure 311 is formed, where the third isolation structure 311 fills the gap between the second semiconductor pillars 303. Second word lines 302 and second bit lines 301 are formed, where each of the second semiconductor pillars 303 is connected to a corresponding one of the second word lines 302 and a corresponding one of the second bit lines 301.

For the second semiconductor pillar 303, a material for forming the second semiconductor pillar 303 includes at least one or more of IGZO or ITO. For example, when the second semiconductor pillar 303 is IGZO, the carrier mobility of IGZO is 20-50 times that of polycrystalline silicon, which is beneficial to increase the carrier mobility of the second semiconductor pillar 303, thereby facilitating reducing the leakage current of the semiconductor structure during operation. Thus, the power consumption of the semiconductor structure is reduced, and the operation efficiency of the semiconductor structure is improved.

For the third isolation structure 311, a material for forming the third isolation structure 311 includes silicon oxide, silicon nitride, or silicon oxynitride, etc. In this embodiment, the material for forming the third isolation structure 311 and the material for forming the first isolation structure 211 are the same and are represented by a same feature. In other embodiments, the material for forming the third isolation structure 311 may be different from the material for forming the first isolation structure 211.

For the second word line 302, a material for forming the second word line 302 includes at least one of polycrystalline silicon, titanium nitride, titanium aluminide, tantalum nitride, tantalum, copper, aluminum, lanthanum, or tungsten. In this embodiment, the material for forming the second word line 302 and the material for forming the first word line 202 are the same and are represented by a same feature. In other embodiments, the material for forming the second word line 302 may be different from the material for forming the first word line 202.

For the second bit line 301, a material for forming the second bit line includes at least one of a metal silicide, copper, or tungsten. In some embodiments, the material for forming the second bit line 301 may be a single metal, a metal compound, or an alloy. The single metal may be copper, aluminum, tungsten, gold, or silver, etc.; the metal compound may be tantalum nitride or titanium nitride; and the alloy may be an alloy material comprising at least two of copper, aluminum, tungsten, gold, or silver. In this embodiment, the material for forming the second bit line 301 and the material for forming the first bit line 201 are the same and are represented by a same feature. In other embodiments, the material for forming the second bit line 301 may be different from the material for forming the first bit line 201.

In some embodiments, the step of forming the second transistor array includes: forming an initial third isolation structure, where the initial third isolation structure is positioned above the first transistor array, and covers the surface of the dielectric layer; forming a plurality of second semiconductor holes extending along the third direction, the second semiconductor holes are positioned in the initial third isolation structure and correspond to the first semiconductor pillars one to one, and a remaining part of the initial third isolation structure is used as the third isolation structure; and forming the second semiconductor pillars to fill the second semiconductor holes.

In some other embodiments, the step of forming the second transistor array includes: forming a second sacrificial layer, where the second sacrificial layer is positioned above the first transistor array; forming a plurality of third grooves extending along the first direction and a plurality of fourth grooves extending along the second direction, where the third grooves and the fourth grooves are positioned in the second sacrificial layer, the fourth groove exposes the top surface of the first spacer, the third grooves and the fourth grooves are equal in depth, and in the second direction, the third grooves and the contact structures are alternately arranged at intervals, and the remaining part of the second sacrificial layer corresponds to the first semiconductor pillars one to one; and forming third isolation structures to fill the third grooves and the fourth grooves; and removing the second sacrificial layer in the third isolation structures, and forming the second semiconductor pillars to fill a gap between the third isolation structures.

By means of the method for forming the second transistor array provided in the above two embodiments, etching of the second semiconductor pillar may be reduced. For example, when the material of the second semiconductor pillar is an amorphous material such as IGZO, the etching needs to consume a lot of costs. For example, the power consumption of a device body, an exhaust gas treatment system, and a peripheral gas supply system in dry etching is relatively large, and the maintenance costs are relatively high, and there also exists a problem of particle pollution to the device, which shortens the service life of the device. However, wet etching is performed isotropically, and there exists a problem of undercut under a mask. Therefore, using the method for forming the second transistor array in the above embodiments may reduce the etching of the amorphous material such as IGZO, thereby avoiding the above problems.

In some other embodiments, the step of forming a second transistor array includes: forming a second semiconductor layer, where the second semiconductor layer is positioned above the first transistor array; forming a plurality of first grooves extending along the first direction and a plurality of second grooves extending along the second direction, where the plurality of first grooves and the plurality of second grooves are positioned in the second semiconductor layer, and a remaining part of the second semiconductor layer is used as the plurality of second semiconductor pillars corresponding to the plurality of first semiconductor pillars one to one; and forming a third isolation structure to fill the plurality of first grooves and the plurality of second grooves. By directly etching the second semiconductor layer, the fabrication processes of the semiconductor structure can be simplified, and the fabrication efficiency of the semiconductor structure can be improved.

Still referring to FIG. 12, in some embodiments, the step of forming the second word line 302 and the second bit line 301 include: forming a first insulating layer 314 covering a surface of the second transistor array 300; and forming a plurality of second word lines 302 and a plurality of second bit lines 301 extending along the second direction Y, where the plurality of second word lines 302 and the plurality of second bit lines 301 are positioned in the first insulating layer 314 and are alternately arranged at intervals in parallel with each other along the first direction X, and in the second direction Y, a same one of the plurality of second word lines 302 or a same one of the plurality of second bit lines 301 is connected to a part of surfaces of adjacent two columns of the second semiconductor pillars 303. The second word lines 302 and the second bit lines 301 formed in this method are arranged in parallel, and in the second direction Y, adjacent two columns of the second semiconductor pillars 303 may share the same second word line 302 or the same second bit line 301, thereby increasing the space utilization of the semiconductor structure, and thus further increasing the integration density of the semiconductor structure.

Figure 13:
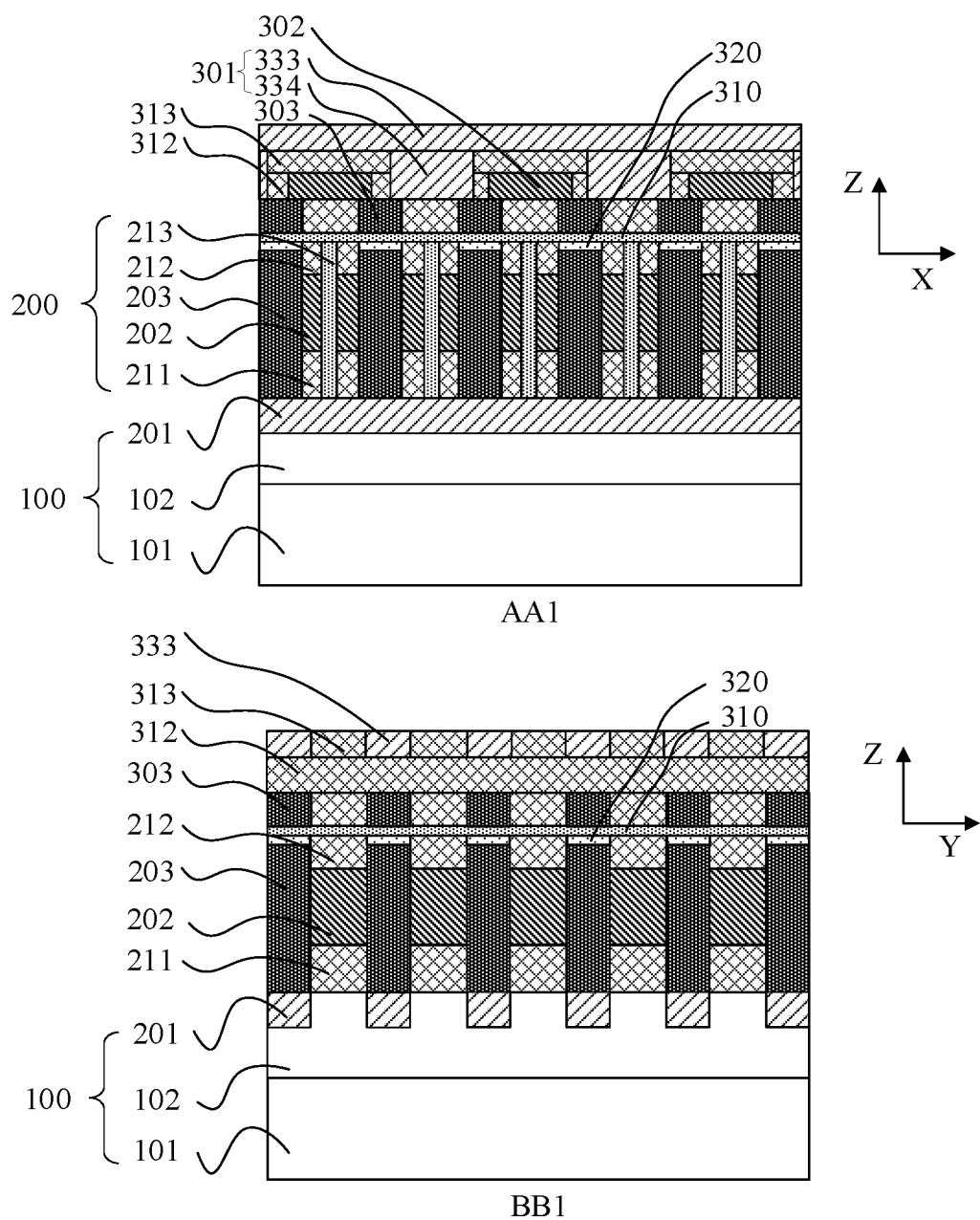

Referring to FIG. 13, in some other embodiments, the step of forming the second word line 302 and the second bit line 301 includes: forming a second insulating layer 312 covering a surface of the second transistor array 300; forming a plurality of second word lines 302 extending along the second direction Y, the plurality of second word lines 302 are positioned in the second insulating layer 312, in the second direction Y, the same second word line 302 is connected to a part of surfaces of adjacent two columns of the second semiconductor pillars 303, and in the first direction X, surfaces of every two columns of the second semiconductor pillars 303 are connected to the same second word line 302; forming a third insulating layer 313 covering surfaces of the second word lines 302 and a surface of the second insulating layer 312; and forming a plurality of second bit lines 301 comprising a plurality of second bit line contact lines 334 extending along the third direction Z and a plurality of second bit line extension lines 333 extending along the first direction X, the plurality of second bit line contact lines 334 are positioned in the second insulating layer 312 and the third insulating layer 313, and the plurality of second bit line extension lines 333 are positioned in the second insulating layer 312. The plurality of second bit line contact lines 334 are arranged in an array along the first direction X and the second direction Y, and the plurality of second bit line contact lines 334 and the plurality of second word lines 302 are alternately arranged at intervals in the first direction X. Each of the plurality of second bit line contact lines 334 is connected to a part of top surfaces of adjacent two of the plurality of second semiconductor pillars 303, and bottoms of the plurality of second bit line extension lines 333 are connected to tops of the plurality of second bit line contact lines 334.

By forming the second word line 302 and the second bit line 301 of the above structure, the second bit line 301 includes the second bit line contact line 334 and the second bit line extension line 333, and the second word line 302 and the second bit line 301 have different extension directions, to prevent producing a parasitic capacitance between the second word line 302 and the second bit line 301 when the second word line 302 and the second bit line 301 are arranged in parallel, thereby preventing having a negative effect on the usage performance of the semiconductor structure. It is to be understood that positional structures of the second word line 302 and the second bit line 301 may be interchanged, which may still constitute a structure where one second semiconductor pillar 303 corresponds to one second word line 302 and one second bit line 301.

For the first insulating layer 314, the second insulating layer 312 and the third insulating layer 313, in this embodiment, the material of the first insulating layer 314, the material of the second insulating layer 312 and the material of the third insulating layer 313 are the same, are the same as the material of the third isolation structure 311, and are represented by a same feature. In some other embodiments, the material of the first insulating layer 314, the material of the second insulating layer 312 and the material of the third insulating layer 313 may be different. The material of the first insulating layer 314, the material of the second insulating layer 312 and the material of the third insulating layer 313 include insulating materials such as silicon oxide, silicon nitride, and silicon oxynitride.

In some embodiments, the method for fabricating a semiconductor structure provided in the above embodiments may be performed repeatedly to form a stacked structure, to integrate more transistor structures in a unit volume, thereby improving the integration density and the usage performance of the semiconductor structure.

According to the method for fabricating a semiconductor structure provided in the embodiments of the present disclosure, the first transistor array having a plurality of first semiconductor pillars and the second transistor array having a plurality of second semiconductor pillars are formed, where the first transistors are connected to corresponding first word lines and corresponding first bit lines, the second transistors are connected to corresponding second word lines and corresponding second bit lines, and the first transistors correspond to the second transistors one to one to form a capacitor-free structure with two transistors, thereby solving a problem that a large number of capacitors need to be fabricated per unit area in the fabrication processes of the semiconductor structure. The capacitor-free structure with two transistors can improve the space utilization of the semiconductor structure and increase integration density of the semiconductor structure.

Another embodiment of the present disclosure provides a semiconductor structure, which is fabricated by means of the above method for fabricating a semiconductor structure, to improve the performance of the semiconductor structure formed. It should be noted that reference may be made to the detailed description of the previous embodiments for the same or corresponding parts as the foregoing embodiment, which is not to be described in detail again herein.

with continued reference to FIG. 12, the semiconductor structure provided by this embodiment includes:

a semiconductor substrate 100; a first transistor array 200; a first spacer 213; a first isolation structure 211; first word lines 202; a second isolation structure 212; a second transistor array 300; a third isolation structure 311; and second word lines 302 and second bit line 301. The semiconductor substrate 100 is provided with a plurality of first bit lines 201 extending along the first direction X. The first transistor array 200 is positioned on the semiconductor substrate 100, and the first transistor array 200 includes a plurality of first semiconductor pillars 203 extending along the third direction Z and arranged in an array in the first direction X and the second direction Y. The first spacer 213 extends along the second direction Y and is positioned between adjacent two columns of first semiconductor pillars 203, where in the first direction X, the first spacer 213 and the first semiconductor pillar 203 are alternately arranged at intervals. The first isolation structure 211 fills a gap between the first spacer 213 and the first semiconductor pillar 203. Each of the plurality of first semiconductor pillars 203 are connected to a corresponding one of the first word lines 202 and a corresponding one of the plurality of first bit lines 201, and the first word line 202 is positioned on a surface of the first isolation structure 211. The second isolation structure 212 is positioned on a surface of the first word line 202. The second transistor array 300 is positioned on the first transistor array 200, the second transistor array 300 includes a plurality of second semiconductor pillars 303 extending along the third direction Z and arranged in an array in the first direction X and the second direction Y, and the plurality of second semiconductor pillars 303 correspond to the plurality of first semiconductor pillars 203 one to one. Each of the plurality of second semiconductor pillars is connected to a corresponding one of the second word lines 302 and a corresponding one of the second bit lines 301.

In some embodiments, the semiconductor structure further includes: a contact structure 320 positioned on the surface of the first semiconductor pillar 203; and a dielectric layer 310 covering at least the surface of the contact structure 320, where the dielectric layer 310 also covers the top surface of the second isolation structure 212 and the top surface of the first spacer 213. The contact structure 320 connects one terminal of the source or the drain of a first transistor to the gate of the second transistor, and the dielectric layer 310 may constitute the insulating layer of the gate part of the second transistor array. By means of the contact structure 320 and the dielectric layer 310, a structure is formed where the first semiconductor pillars 203 correspond to the second semiconductor pillars one to one.

In some embodiments, referring to FIG. 12, the second word line 302 and the second bit line 301 include: a first insulating layer 314 covering the surface of the second transistor array 300. The second word line 302 and the second bit line 301 extend along the second direction Y and are arranged in parallel in the first insulating layer 314. In the second direction Y, the same second word line 302 or second bit line 301 is connected to a part of surfaces of adjacent two columns of second semiconductor pillars 303. The second word line 302 and the second bit line 301 are arranged in parallel, and in the second direction Y, adjacent two columns of second semiconductor pillars 303 may share the same second word line 302 or second bit line 301, thereby increasing the space utilization of the semiconductor structure, and further increasing the integration density of the semiconductor structure.

Referring to FIG. 13, in some other embodiments, the second word line 302 and the second bit line 301 respectively include a second insulating layer 312 and a third insulating layer 313. The second insulating layer 312 covers the top surface of the second semiconductor pillar 303 and the top surface of the third isolation structure 311. The second word lines 302 extend along the second direction Y and are arranged in parallel in the second insulating layer 312. In the second direction Y, the same second word line 302 is connected to a part of surfaces of adjacent two columns of second semiconductor pillars 303; and in the first direction X, a part of surfaces of every two columns of second semiconductor pillars 303 are connected to the same second word line 302. The third insulating layer 313 covers the second word line 302 and the surface of the second insulating layer 312. The second bit line 301 includes second bit line contact lines 334 and second bit line extension lines 333, where the second bit line contact lines 334 are arranged in the second insulating layer 312 and the third insulating layer 313 along the third direction Z and are arranged in an array along the first direction X and the second direction Y. the second bit line contact lines 334 and the second word lines 302 are alternately arranged at intervals in the first direction X, and each of the second bit line contact lines 334 is connected to a part of surfaces of adjacent two of the plurality of second semiconductor pillars 303. The second bit line extension lines 333 are arranged in the third insulating layer 313 along the second direction Y, and bottoms of the second bit line extension lines 333 are connected to tops of the second bit line contact lines 334. By forming the second word line 302 and the second bit line 301 of the above structure, the second bit line 301 includes the second bit line contact line 334 and the second bit line extension line 333, and the second word line 302 and the second bit line 301 have different extension directions, to prevent producing a parasitic capacitance between the second word line 302 and the second bit line 301 when the second word line 302 and the second bit line 301 are arranged in parallel, thereby preventing having a negative effect on the usage performance of the semiconductor structure.

It is to be understood that in some embodiments, the semiconductor structures provided in the above embodiments may be stacked to form a stacked 2T0C semiconductor structure, thereby increasing the integration density of the semiconductor structure, and improving the usage performance of the semiconductor structure.

According to the semiconductor structure provided by the present disclosure, the first transistor array with a plurality of first semiconductor pillars and the second transistor array with a plurality of second semiconductor pillars are formed, where the first transistors are connected to corresponding first word lines and corresponding first bit lines, the second transistors are connected to corresponding second word lines and corresponding second bit lines, and the first transistors correspond to the second transistors one to one to form a capacitor-free structure with two transistors, thereby solving the problem that a large number of capacitors need to be fabricated per unit area in the fabrication processes of the semiconductor structure. The capacitor-free structure with two transistors may improve the space utilization of the semiconductor structure and increase the integration density of the semiconductor structure.

Those of ordinary skill in the art can understand that the above-mentioned embodiments are some embodiments for realizing the present disclosure, but in practical applications, various changes may be made to them in form and details without departing from the spirit and scope of the present disclosure.

What is claimed is:

1. A method for fabricating a semiconductor structure, comprising:
  providing a semiconductor substrate, the semiconductor substrate being provided with a plurality of first bit lines extending along a first direction;
  forming a first transistor array on the semiconductor substrate, the first transistor array comprising a plurality of first semiconductor pillars;
  forming first word lines, each of the plurality of first semiconductor pillars being connected to a corresponding one of the first word lines and a corresponding one of the plurality of first bit lines;
  forming a second transistor array on the first transistor array, the second transistor array comprising a plurality of second semiconductor pillars, and the plurality of first semiconductor pillars being corresponding to the plurality of second semiconductor pillars one to one; and
  forming second word lines and second bit lines, each of the plurality of second semiconductor pillars being connected to a corresponding one of the second word lines and a corresponding one of the second bit lines.

2. The method for fabricating a semiconductor structure according to claim 1, wherein the plurality of first semiconductor pillars formed extend along a third direction and are arranged in an array in the first direction and a second direction; and the first word lines formed extend along the second direction and surround the plurality of first semiconductor pillars.

3. The method for fabricating a semiconductor structure according to claim 2, wherein the forming a first transistor array comprises:
  forming a first sacrificial layer, the first sacrificial layer covering a surface of the semiconductor substrate;
  forming a plurality of first trenches extending along the first direction and a plurality of second trenches extending along the second direction, the plurality of first trenches and the plurality of second trenches being positioned in the first sacrificial layer, bottoms of the plurality of first trenches and bottoms of the plurality of the second trenches being flush with top surfaces of the plurality of first bit lines, and in the second direction, projections of the plurality of first trenches and projections of the plurality of first bit lines being parallel to each other and alternately arranged;
  forming first isolation structures to fill the plurality of first trenches and the plurality of second trenches; and
  removing the first sacrificial layer between adjacent two of the first isolation structures, and forming the plurality of first semiconductor pillars to fill a gap between adjacent two of the first isolation structures.

4. The method for fabricating a semiconductor structure according to claim 3, wherein the forming first word lines comprises:
  removing the first isolation structure by part of a height;
  forming a first word line to cover a surface of the first isolation structure;
  forming a second isolation structure to cover a surface of the first word line; and
  forming a first spacer, the first spacer extending along the second direction and being positioned between adjacent two columns of the plurality of first semiconductor pillars, and in the first direction, the first spacer and each of the plurality of first semiconductor pillars being alternately arranged at intervals.

5. The method for fabricating a semiconductor structure according to claim 2, wherein the forming a first transistor array comprises:
  forming an initial first isolation structure, the initial first isolation structure covering a surface of the semiconductor substrate;
  forming a plurality of first semiconductor holes extending along the third direction, the plurality of first semiconductor holes being positioned in the initial first isolation structure and arranged in an array in the first direction and the second direction, the plurality of first semiconductor holes exposing surfaces of the plurality of first bit lines, and a remaining part of the initial first isolation structure being used as a first isolation structure; and forming the plurality of first semiconductor pillars to fill the plurality of first semiconductor holes.

6. The method for fabricating a semiconductor structure according to claim 2, wherein the forming a first transistor array and the forming first word lines comprise:

forming an initial first isolation structure, the initial first isolation structure covering a surface of the semiconductor substrate;

forming a plurality of first isolation trenches extending along the second direction and a plurality of first semiconductor holes extending along the third direction, the plurality of first isolation trenches and the plurality of first semiconductor holes being positioned in the initial first isolation structure, the plurality of first semiconductor holes being arranged in an array in the first direction and the second direction and exposing surfaces of the plurality of first bit lines, and in the first direction, the plurality of first isolation trenches and the plurality of first semiconductor holes being alternately arranged at intervals;

forming a first spacer to fill the plurality of first isolation trenches, and forming the plurality of first semiconductor pillars to fill the plurality of first semiconductor holes;

removing the initial first isolation structure by part of a height, and a remaining part of the initial first isolation structure being used as the first isolation structure;

forming a first word line to cover a surface of the first isolation structure; and forming a second isolation structure to cover the first word lines.

7. The method for fabricating a semiconductor structure according to claim 1, wherein after the first word lines are formed and before the second transistor layer is formed, the method further comprises:

forming a contact structure, the contact structure being positioned on top surfaces of the plurality of first semiconductor pillars; and forming a dielectric layer, the dielectric layer covering at least a surface of the contact structure.

8. The method for fabricating a semiconductor structure according to claim 1, wherein the plurality of second semiconductor pillars formed extend along the third direction and are arranged in an array in the first direction and the second direction; and the forming a second transistor array further comprises: forming a third isolation structure, the third isolation structure filling a gap between adjacent two of the plurality of second semiconductor pillars.

9. The method for fabricating a semiconductor structure according to claim 8, wherein the forming a second transistor array comprises:

forming an initial third isolation structure, the initial third isolation structure being positioned above the first transistor array;

forming a plurality of second semiconductor holes extending along the third direction, the plurality of second semiconductor holes being positioned in the initial third isolation structure and corresponding to the plurality of first semiconductor pillars one to one, and a remaining part of the initial third isolation structure being used as the third isolation structure; and forming the plurality of second semiconductor pillars to fill the plurality of second semiconductor holes.

10. The method for fabricating a semiconductor structure according to claim 8, wherein the forming a second transistor array comprises:

forming a second semiconductor layer, the second semiconductor layer being positioned above the first transistor array;

forming a plurality of first grooves extending along the first direction and a plurality of second grooves extending along the second direction, the plurality of first grooves and the plurality of second grooves being positioned in the second semiconductor layer, and a remaining part of the second semiconductor layer being used as the plurality of second semiconductor pillars corresponding to the plurality of first semiconductor pillars one to one; and forming a third isolation structure to fill the plurality of first grooves and the plurality of second grooves.

11. The method for fabricating a semiconductor structure according to claim 8, wherein the forming a second transistor array comprises:

forming a second sacrificial layer, the second sacrificial layer being positioned above the first transistor array;

forming a plurality of third grooves extending along the first direction and a plurality of fourth grooves extending along the second direction, the plurality of third grooves and the plurality of fourth grooves being positioned in the second sacrificial layer, and a remaining part of the second sacrificial layer corresponding to the plurality of first semiconductor pillars one to one;

forming a third isolation structure to fill the plurality of third grooves and the plurality of fourth grooves; and removing the second sacrificial layer in the third isolation structures, and forming the plurality of second semiconductor pillars to fill a gap between adjacent two of the third isolation structures.

12. The method for fabricating a semiconductor structure according to claim 8, wherein the forming second word lines and the forming second bit lines comprise:

forming a first insulating layer, the first insulating layer covering a surface of the second transistor array; and forming a plurality of second word lines and a plurality of second bit lines extending along the second direction, the plurality of second word lines and the plurality of second bit lines being positioned in the first insulating layer and being parallel to each other in the first direction and being alternately arranged at intervals, and in the second direction, a same one of the plurality of second word lines or a same one of the plurality of second bit lines being connected to a part of surfaces of adjacent two columns of the plurality of second semiconductor pillars.

13. The method for fabricating a semiconductor structure according to claim 8, wherein the forming second word lines and the forming second bit lines comprise:

forming a second insulating layer, the second insulating layer covering a surface of the second transistor array;

forming a plurality of second word lines extending along the second direction, the plurality of second word lines being positioned in the second insulating layer, in the second direction, a same one of the plurality of second word lines being connected to a part of surfaces of adjacent two columns of the plurality of second semiconductor pillars, and in the first direction, surfaces of every two columns of the plurality of second semiconductor pillars being connected to a same one of the plurality of second word lines;

forming a third insulating layer, the third insulating layer covering surfaces of the plurality of second word lines and a surface of the second insulating layer; and forming a plurality of second bit lines, the plurality of second bit lines comprising a plurality of second bit line contact lines extending along the third direction and a plurality of second bit line extension lines extending along the first direction, the plurality of second bit line contact lines being positioned in the second insulating layer and the third insulating layer, the plurality of second bit line extension lines being positioned in the third insulating layer, the plurality of second bit line contact lines being arranged in an array in the first direction and the second direction, the plurality of second bit line contact lines and the plurality of second word lines being alternately arranged at intervals in the first direction, each of the plurality of second bit line contact lines being connected to a part of surfaces of adjacent two of the plurality of second semiconductor pillars, and bottoms of the plurality of second bit line extension lines being connected to tops of the plurality of second bit line contact lines.

14. The method for fabricating a semiconductor structure according to claim 1, wherein a material for forming the plurality of first semiconductor pillars and the plurality of second semiconductor pillars comprises at least one or more of Indium Gallium Zinc Oxide (IGZO), Indium Zinc Oxide (IZO), or Indium Tin Oxide (ITO).

* * * * *